(12) United States Patent
Park et al.

(10) Patent No.: US 12,278,258 B2
(45) Date of Patent: Apr. 15, 2025

(54) LIGHT EMITTING DIODE DISPLAY APPARATUS HAVING A TRENCH STRUCTURE

(71) Applicant: LG Display Co., Ltd., Seoul (KR)

(72) Inventors: MoonHo Park, Paju-si (KR); Seunghyo Ko, Paju-si (KR)

(73) Assignee: LG Display Co., Ltd., Seoul (KR)

( * ) Notice: Subject to any disclaimer, the term of this patent is extended or adjusted under 35 U.S.C. 154(b) by 416 days.

(21) Appl. No.: 17/736,656

(22) Filed: May 4, 2022

(65) Prior Publication Data

US 2022/0262854 A1 Aug. 18, 2022

Related U.S. Application Data

(63) Continuation of application No. 16/732,104, filed on Dec. 31, 2019, now Pat. No. 11,348,967.

(30) Foreign Application Priority Data

Dec. 31, 2018 (KR) .......................... 10-2018-0174268
Aug. 23, 2019 (KR) .......................... 10-2019-0103772

(51) Int. Cl.
*H01L 27/15* (2006.01)
*H01L 33/24* (2010.01)
(Continued)

(52) U.S. Cl.
CPC ............ *H01L 27/156* (2013.01); *H01L 33/24* (2013.01); *H01L 33/38* (2013.01); *H01L 33/405* (2013.01); *H01L 33/42* (2013.01); *H01L 33/62* (2013.01); *G09G 3/3266* (2013.01); *G09G 3/3275* (2013.01); *H01L 27/124* (2013.01); *H01L 27/1255* (2013.01)

(58) Field of Classification Search
CPC ....... H01L 27/156; H01L 33/24; H01L 33/38; H01L 33/405; H01L 33/42; H01L 33/62; H01L 25/0753; H10K 59/878
See application file for complete search history.

(56) References Cited

U.S. PATENT DOCUMENTS 9,178,123 B2 11/2015 Sakariya et al.
10,084,009 B2 9/2018 Kim
(Continued)

FOREIGN PATENT DOCUMENTS

CN 101599457 A 12/2009
CN 103227169 A 7/2013
(Continued)

*Primary Examiner* — S M Sohel Imtiaz
(74) *Attorney, Agent, or Firm* — Seed IP Law Group LLP

(57) ABSTRACT

A light emitting diode display apparatus includes a display substrate having a plurality of subpixel areas; and a light emitting diode disposed on the display substrate to correspond to a corresponding subpixel area of the plurality of subpixel areas, wherein the light emitting diode includes an emission area and a non-emission area adjacent to the emission area, wherein the light emitting diode includes a trench part provided to overlap a boundary between the emission area and the non-emission area, and wherein the trench part is configured such that a side light emitted from the emission area is reflected in a display direction of the light emitting diode display apparatus.

21 Claims, 8 Drawing Sheets

(51) Int. Cl.
  *H01L 33/38*    (2010.01)
  *H01L 33/40*    (2010.01)
  *H01L 33/42*    (2010.01)
  *H01L 33/62*    (2010.01)
  G09G 3/3266    (2016.01)
  G09G 3/3275    (2016.01)
  H01L 27/12     (2006.01)

(56) References Cited

U.S. PATENT DOCUMENTS

| | | | |
|---|---|---|---|
| 2002/0063258 A1 | 5/2002 | Motoki | |
| 2013/0292714 A1 | 11/2013 | Kim | |
| 2015/0236229 A1 | 8/2015 | Kim | |
| 2015/0349232 A1* | 12/2015 | Lee | H01L 29/861 |
| | | | 257/91 |
| 2016/0359142 A1* | 12/2016 | Huangfu | H10K 59/00 |
| 2017/0263178 A1* | 9/2017 | Bae | G09G 3/32 |
| 2017/0280234 A1* | 9/2017 | Choi | H04R 1/025 |
| 2018/0175268 A1 | 6/2018 | Moon et al. | |
| 2019/0319163 A1* | 10/2019 | Schuele | H01L 33/0095 |

FOREIGN PATENT DOCUMENTS

| | | |
|---|---|---|
| CN | 104733501 A | 6/2015 |
| CN | 108206234 A | 6/2018 |
| KR | 19990088667 A | 12/1999 |
| KR | 20150084922 A | 7/2015 |

\* cited by examiner

LIGHT EMITTING DIODE DISPLAY APPARATUS HAVING A TRENCH STRUCTURE

CROSS-REFERENCE TO RELATED APPLICATIONS

This application is a continuation of U.S. patent application Ser. No. 16/732,104, Dec. 31, 2019; which claims the benefit of the Korean Patent Application No. 10-2019-0103772, filed Aug. 23, 2019; and Korean Patent Application No. 10-2018-0174268, filed Dec. 31, 2018, which are hereby incorporated by reference as if fully set forth herein.

BACKGROUND

Technical Field

The present disclosure relates to a light emitting diode display apparatus including a light emitting diode.

Description of the Related Art

With the advancement of information-oriented society, the requirements for display apparatuses for displaying an image are increasing, and various display apparatuses such as liquid crystal display (LCD) apparatuses, plasma display apparatuses, and organic light emitting display apparatuses are being used.

Recently, display apparatuses including a light emitting diode are being developed.

Display apparatuses including the light emitting diode uses the light emitting diode as a pixel and are capable of being miniaturized and weight-lightened, and thus, may be variously applied to smart watches, mobile devices, virtual reality (VR) apparatuses, augmented reality (AR) apparatuses, and flexible display apparatuses.

Moreover, display apparatuses including the light emitting diode are low-power apparatuses having high efficiency and are miniaturized, thinned, and weight-lightened, and moreover, have a long lifetime, do not need a warm-up time, and are very fast in turn-on speed and turn-off speed.

BRIEF SUMMARY

Despite the aforementioned non-limiting advantages, the display apparatuses including a general light emitting diode still have room for further improvement. For example, the general light emitting diode has the structural problems of having difficulty in receiving lateral lights that diffuse from the sides of a light emitting layer in a display direction of the light emitting diode. Moreover, a hole-electron recombination path within the light emitting diode is limited to a rectilinear path and thereby reduces the emission efficiency of the display apparatus. Accordingly, the present disclosure is directed to providing a light emitting diode display apparatus that substantially obviates one or more problems due to limitations and disadvantages of the related art.

The inventors have recognized problems of general light emitting diode display apparatuses and have invented a light emitting diode display apparatus having a structure which reflects light, emitted from a light emitting layer of a light emitting diode to a side, in a display direction to enhance light extraction efficiency in a display direction of the light emitting diode display apparatus.

An aspect of the present disclosure is directed to providing a light emitting diode display apparatus which reflects side light, diffusing in a direction from a light emitting layer of a light emitting diode to a side, in a display direction to enhance the light extraction efficiency of the light emitting diode.

Additional advantages and features of the disclosure will be set forth in part in the description which follows and in part will become apparent to those having ordinary skill in the art upon examination of the following or may be learned from practice of the disclosure. Other advantages of the disclosure may be realized and attained by the structure particularly pointed out in the written description and claims hereof as well as the appended drawings.

To achieve these and other advantages and in accordance with the purpose of the disclosure, as embodied and broadly described herein, there is provided a light emitting diode display apparatus including a display substrate where a plurality of subpixel areas are formed and a light emitting diode disposed on the display substrate to correspond to a corresponding subpixel area of the plurality of subpixel areas, the light emitting diode including an emission area and a non-emission area adjacent to the emission area, wherein the light emitting diode includes a first semiconductor layer, an active layer disposed on the first semiconductor layer, a second semiconductor layer disposed on the active layer, and a trench part provided to overlap a boundary between the emission area and the non-emission area.

In another aspect of the present disclosure, there is provided a light emitting diode display apparatus including a display substrate where a plurality of subpixel areas are formed and a light emitting diode disposed on the display substrate to correspond to a corresponding subpixel area of the plurality of subpixel areas, the light emitting diode including an emission area corresponding to a center portion thereof and a non-emission area adjacent to the emission area, wherein the light emitting diode includes a first mesa part in the emission area, a second mesa part apart from the first mesa part by a certain interval, and a trench part between the first mesa part and the second mesa part.

In yet another aspect of the present disclosure, there is provided a light emitting diode display apparatus including a display substrate having a plurality of subpixel areas; and a light emitting diode disposed on the display substrate to correspond to a corresponding subpixel area of the plurality of subpixel areas, wherein the light emitting diode includes an emission area and a non-emission area adjacent to the emission area, wherein each of the emission area and the non-emission area includes an emitting layer; wherein the light emitting diode includes a trench part provided to overlap a boundary between the emission area and the non-emission area, and wherein the trench part is configured such that a side light emitted from the emitting layer in the emission area is reflected in a display direction of the light emitting diode display apparatus.

In still another aspect of the present disclosure, there is provided a light emitting diode display apparatus including a display substrate having a plurality of subpixel areas; and a light emitting diode disposed on the display substrate, wherein the light emitting diode including an emission area and a non-emission area adjacent to the emission area, wherein the light emitting diode comprises: a first mesa part in the emission area; a second mesa part apart from the first mesa part by a certain interval; and a trench part between the first mesa part and the second mesa part.

According to an embodiment of the present disclosure, a light emitting diode display apparatus including a light emitting diode with enhanced light extraction efficiency may be provided.

According to an embodiment of the present disclosure, light extraction efficiency may be enhanced, thereby providing a light emitting diode display apparatus including a light emitting diode with enhanced power consumption efficiency.

It is to be understood that both the foregoing general description and the following detailed description of the present disclosure are exemplary and explanatory and are intended to provide further explanation of the disclosure as claimed.

BRIEF DESCRIPTION OF THE SEVERAL VIEWS OF THE DRAWINGS

The accompanying drawings, which are included to provide a further understanding of the disclosure and are incorporated in and constitute a part of this application, illustrate embodiments of the disclosure and together with the description serve to explain the principle of the disclosure. In the drawings.

DETAILED DESCRIPTION

Figure 1:
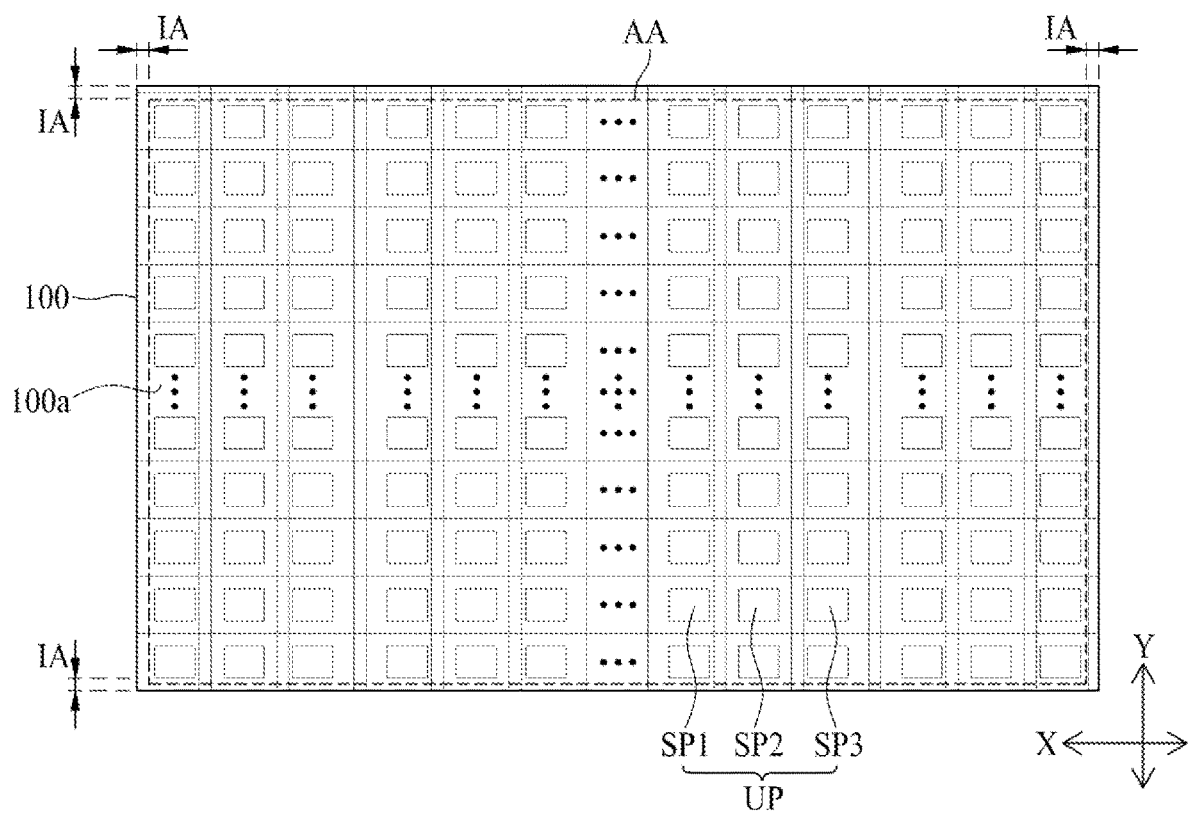
FIG. 1 is a plan view of a light emitting diode display apparatus according to the present disclosure.

Reference will now be made in detail to the exemplary embodiments of the present disclosure, examples of which are illustrated in the accompanying drawings. Wherever possible, the same reference numbers will be used throughout the drawings to refer to the same or like parts.

Advantages and features of the present disclosure, and implementation methods thereof will be clarified through following embodiments described with reference to the accompanying drawings. The present disclosure may, however, be embodied in different forms and should not be construed as limited to the embodiments set forth herein. Rather, these embodiments are provided so that this disclosure will be thorough and complete, and will fully convey the scope of the present disclosure to those skilled in the art.

A shape, a size, a ratio, an angle, and a number disclosed in the drawings for describing embodiments of the present disclosure are merely an example, and thus, the present disclosure is not limited to the illustrated details. Like reference numerals refer to like elements throughout. In the following description, when the detailed description of the relevant known technology is determined to unnecessarily obscure the important point of the present disclosure, the detailed description will be omitted. In a case where 'comprise', 'have', and 'include' described in the present specification are used, another part may be added unless 'only~' is used. The terms of a singular form may include plural forms, and vice versa, unless referred to the contrary.

In construing an element, the element is construed as including an error range although there is no explicit description.

In describing a position relationship, for example, when a position relation between two parts is described as 'on~', 'over~', 'under~' and 'next~', one or more other parts may be disposed between the two parts unless 'just' or 'direct' is used.

In describing a time relationship, for example, when the temporal order is described as 'after', 'subsequent', 'next~', and 'before~' a case which is not continuous may be included unless 'just' or 'direct' is used.

In describing elements of the present disclosure, the terms "first", "second", etc., may be used. The terms are merely for differentiating one element from another element, and the essence, sequence, order, or number of a corresponding element should not be limited by the terms. It will be understood that when an element or layer is described as being "connected", "coupled", or "adhered" to another element or layer, the element or layer can be directly connected, coupled or adhered to the other element or layer, but the other element or layer can be "disposed" between elements or layers, or elements or layers can be "connected", "coupled", or "adhered" to each other through the other element or layer.

In describing the elements of the present disclosure, terms such as first, second, A, B, (a), (b), etc., may be used. Such terms are used for merely discriminating the corresponding elements from other elements and the corresponding elements are not limited in their essence, sequence, or precedence by the terms. It will be understood that when an element or layer is referred to as being "on" or "connected to" another element or layer, it can be directly on or directly connected to the other element or layer, or intervening elements or layers may be present. Also, it should be understood that when one element is disposed on or under another element, this may denote a case where the elements are disposed to directly contact each other, but may denote that the elements are disposed without directly contacting each other.

A first direction, a second direction, and a vertical axis direction should not be construed as only a geometric relationship where a relationship therebetween is vertical, and may denote having a broader directionality within a scope where elements of the present disclosure operate functionally.

An X axis direction, a Y axis direction, and a Z axis direction should not be construed as only a geometric relationship where a relationship therebetween is vertical, and may denote having a broader directionality within a scope where elements of the present disclosure operate functionally.

The term "at least one" should be understood as including any and all combinations of one or more of the associated listed items. For example, the meaning of "at least one of a first item, a second item, and a third item" denotes the combination of all items proposed from two or more of the first item, the second item, and the third item as well as the first item, the second item, or the third item.

Features of various embodiments of the present disclosure may be partially or overall coupled to or combined with each other, and may be variously inter-operated with each other and driven technically as those skilled in the art can sufficiently understand. The embodiments of the present disclosure may be carried out independently from each other, or may be carried out together in co-dependent relationship.

Hereinafter, embodiments of a light emitting diode display apparatus according to the present disclosure will be described in detail with reference to the accompanying drawings. In adding reference numerals to elements of each of the drawings, although the same elements are illustrated in other drawings, like reference numerals may refer to like elements. Also, for convenience of description, a scale of each of elements illustrated in the accompanying drawings differs from a real scale, and thus, is not limited to a scale illustrated in the drawings.

Figure 2:
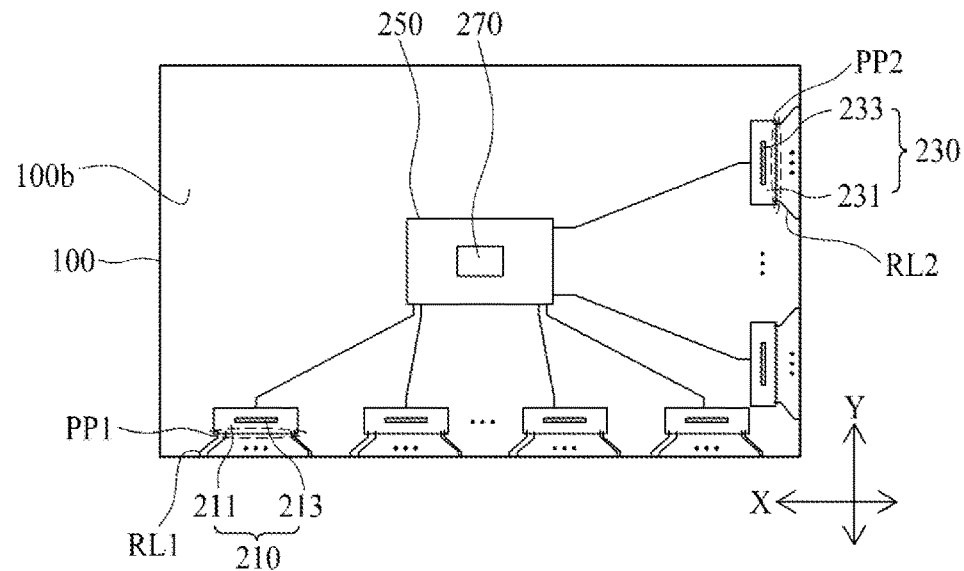
FIG. 2 is a diagram illustrating a rear surface of a substrate illustrated in FIG. 1.
Figure 3:
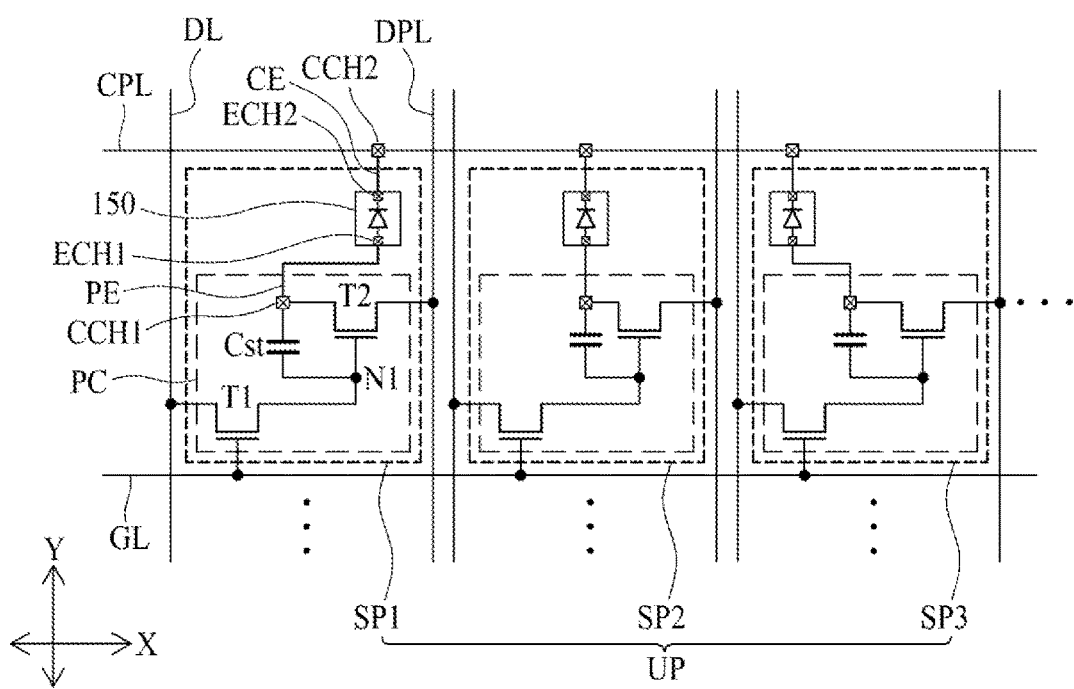
FIG. 3 is a diagram for describing a configuration of a unit pixel illustrated in FIG. 1.

FIG. 1 is a plan view of a light emitting diode display apparatus according to the present disclosure, FIG. 2 is a diagram illustrating a rear surface of a substrate illustrated in FIG. 1, and FIG. 3 is a diagram for describing a configuration of a unit pixel illustrated in FIG. 1.

Referring to FIGS. 1 to 3, the light emitting diode display apparatus according to the present disclosure may include a display substrate 100 and a plurality of unit pixels UP.

The display substrate 100 may be a thin film transistor (TFT) array substrate and may include a glass or plastic material. The display substrate 100 according to an embodiment may include an active area AA and an inactive area IA adjacent to the active area AA. In one embodiment, the inactive area IA may surround the active area AA. The active area AA may be referred to as a central area of the display substrate 100, other than the inactive area IA. The inactive area IA may be provided between an outer surface of the display substrate 100 (e.g., outermost side surface of the substrate) and the active area AA. The inactive area IA, may have a relatively narrow width, and may be referred to as a bezel area.

Each of the plurality of unit pixels UP may be provided in the active area AA. In this case, each of the plurality of unit pixels UP may be provided in the active area AA to have a predetermined pixel pitch in a first direction X (e.g., a first horizontal axis direction) and to have a predetermined pixel pitch in a second direction Y (e.g., a second horizontal axis direction). Here, the first direction X may be parallel to a first lengthwise direction X of the display substrate 100 (for example, a long-side lengthwise direction of the display substrate 100), and the second direction Y may be parallel to a second lengthwise direction Y of the display substrate 100 (for example, a short-side lengthwise direction of the display substrate 100).

The display substrate 100 according to an embodiment may include a plurality of pixel driving lines and a plurality of subpixels SP1, SP2, SP3.

The pixel driving lines may be provided on an upper surface 100a of the display substrate 100 and may provide a signal needed for each of the plurality of subpixels SP1, SP2, SP3. The pixel driving lines according to an embodiment may include a plurality of gate lines GL, a plurality of data lines DL, a plurality of driving power lines DPL, and a plurality of common power lines CPL.

Each of the plurality of gate lines GL may be provided on the upper surface 100a of the display substrate 100 and may long extend in the first direction X of the display substrate 100. Also, the plurality of gate lines GL may be apart from one another by a certain interval in the second direction Y.

The plurality of data lines DL may be provided on the upper surface 100a of the display substrate 100 to overlap with the plurality of gate lines GL and may long extend in the second direction Y of the display substrate 100. Also, the plurality of data lines DL may be apart from one another by a certain interval in the first direction X.

The plurality of driving power lines DPL may be provided on the display substrate 100 in parallel with the plurality of data lines DL and may be formed along with the plurality of data lines DL. Each of the plurality of driving power lines DPL may provide a pixel driving power supplied from the outside to a subpixel SP adjacent to the driving power lines.

The plurality of common power lines CPL may be provided on the display substrate 100 in parallel with the plurality of gate lines GL and may be formed along with the plurality of gate lines GL. Each of the plurality of common power lines CPL may provide adjacent subpixels SP1, SP2, SP3 with a common power supplied from the outside.

Each of the plurality of subpixels SP1, SP2, SP3 may be provided in a subpixel area formed adjacent to a gate line GL and a data line DL. Each of the plurality of subpixels SP1, SP2, SP3 may be referred to as a minimum-unit area which actually emits light.

At least three adjacent subpixels SP1, SP2, SP3 may configure one unit pixel UP for displaying colors. For example, the one unit pixel UP may include a red subpixel SP1, a green subpixel SP2, and a blue subpixel SP3 which are adjacent to one another in the first direction X and in other embodiments may further include a white subpixel for enhancing luminance.

Each of the plurality of subpixels SP1, SP2, SP3 according to an embodiment may include a pixel circuit PC and a light emitting diode 150.

The pixel circuit PC may be provided in a circuit area formed in each subpixel SP and may be connected to a gate line GL, a data line DL, and a driving power line DPL which adjacent to the subpixel SP. The pixel circuit PC may control a current flowing in the light emitting diode 150 according to a data signal from the data line DL in response to a scan pulse from the gate line GL, based on the pixel driving power supplied through the driving power line DPL. The pixel circuit PC according to an embodiment may include a switching TFT T1, a driving TFT T2, and a capacitor Cst.

The switching TFT T1 may include a gate electrode connected to the gate line GL, a first electrode connected to the data line DL, and a second electrode connected to a gate electrode of the driving TFT T2. Here, the first and second electrodes of the switching TFT T1 may each be a source electrode or a drain electrode on the basis of a direction of a current. The switching TFT T1 may be turned on based on the scan pulse supplied through the gate line GL and may provide the driving TFT T2 with the data signal supplied through the data line DL.

The driving TFT T2 may be turned on with a voltage provided from the switching TFT T1 a voltage of the capacitor Cst, and thus, may control the amount of a current flowing from the driving power line DPL to the light emitting diode 150. To this end, the driving TFT T2 according to an embodiment may include a gate electrode N1 connected to a second electrode of the switching TFT T1, a drain electrode connected to the driving power line DPL, and a source electrode connected to the light emitting diode 150. The driving TFT T2 may control a data current flowing from the driving power line DPL to the light emitting diode 150 on the basis of the data signal provided from the switching TFT T1, thereby controlling the light emission of the light emitting diode 150.

The capacitor Cst may be provided in an overlapping area between the gate electrode N1 and the source electrode of the driving TFT T2 and may store a voltage corresponding to the data signal supplied to the gate electrode of the driving TFT T2 and may turn on the driving TFT T2 with the stored voltage.

The light emitting diode 150 may be mounted in a region corresponding to each of the plurality of subpixels SP1, SP2, SP3 on a substrate. The light emitting diode 150 may be electrically connected to the common power line CPL and the pixel circuit PC of a corresponding subpixel SP, and thus, may emit light with a current flowing from the pixel circuit PC (e.g., the driving TFT T2) through the common power line CPL. The light emitting diode 150 according to an embodiment may be a light emitting diode or a micro light emitting chip emitting one of red light, green light, blue light, and white light. Here, the micro light emitting chip may have a scale of about 1 μm to 100 μm, but is not limited thereto and may have a size which is less than that of an emission area, other than a circuit area occupied by the pixel circuit PC, of a subpixel area.

The light emitting diode display apparatus according to the present embodiment may further include a display driving circuit.

The display driving circuit may be disposed on a rear surface of the display substrate 100 and may allow the light emitting diode 150 provided in each subpixel to emit light. The display driving circuit according to an embodiment may include a plurality of first pad parts PP1, a plurality of first routing line RL1, a plurality of second pad parts PP2, a plurality of second routing line RL2, a data driving circuit 210, a gate driving circuit 230, a control board 250, and a timing controller 270.

Moreover, according to another embodiment of the present disclosure, the data driving circuit 210, the gate driving circuit 230, the control board 250, and the timing controller 270 are illustrated as being provided on a rear surface 110b of the substrate in FIG. 2, but are not limited thereto and the data driving circuit 210, the gate driving circuit 230, the control board 250, and the timing controller 270 may be disposed in parallel with the substrate on the basis of a design of the display apparatus.

The plurality of first pad parts PP1 may be arranged at certain intervals at a first side rear edge of the display substrate 100. Each of the plurality of first pad parts PP1 may include a plurality of first pads.

The plurality of first routing lines RL1 may be electrically connected to a plurality of pixel driving lines (in more detail, respective ends of the plurality of data lines DL) provided on a front surface 100a of the display substrate 100, and moreover, may be provided in a first inactive area IA, a first outer surface, and a rear edge of the display substrate 100 and may be electrically connected to the plurality of first pad parts PP1. Here, the first inactive area IA of the display substrate 100 may be a lower edge region of the display substrate 100 illustrated in FIG. 1.

The plurality of second pad parts PP2 may be arranged at certain intervals at a second side rear edge of the display substrate 100. Each of the plurality of second pad parts PP2 may include a plurality of second pads.

The plurality of second routing lines RL2 may be electrically connected to the plurality of pixel driving lines (in more detail, respective ends of the plurality of gate lines GL) provided on an upper surface 100a of the display substrate 100, and moreover, may be provided in a second inactive area IA, a second outer surface, and the rear edge of the display substrate 100 and may be electrically connected to the plurality of second pad parts PP2. Here, the second inactive area IA of the display substrate 100 may be a right edge region of the display substrate 100 illustrated in FIG. 1.

The data driving circuit 210 may include a plurality of data flexible circuit film 211 and a plurality of data driving integrated circuits (ICs) 213.

The plurality of data flexible circuit films 211 may be respectively attached on the plurality of first pad parts PP1 provided on a rear surface 100b of the display substrate 100 through a film attaching process.

Each of the plurality of data driving integrated circuits 213 may be individually mounted on a corresponding data flexible circuit film 211 of the plurality of data flexible circuit films 211. Each of the plurality of data driving integrated circuits 213 may receive subpixel data and a data control signal each provided from the timing controller 270, convert the subpixel data into an analog subpixel-based data voltage, and supply the data voltage to a corresponding data line DL.

The gate driving circuit 230 may include a plurality of gate flexible circuit films 231 and a plurality of gate driving integrated circuits 233.

Each of the plurality of gate driving integrated circuits 233 may be individually mounted on a corresponding gate flexible circuit film 231 of the plurality of gate flexible circuit films 231. Each of the plurality of gate driving integrated circuits 233 may generate a scan pulse on the basis of a gate control signal provided from the timing controller 270 and may supply the generated scan pulse to a corresponding gate line GL in a predetermined order.

Optionally, the plurality of gate driving integrated circuits 233 may be directly mounted on the rear surface 100b of the display substrate 100 so as to be respectively connected to the plurality of second pad parts PP2 without being mounted on the gate flexible circuit film 231. Here, each of the plurality of gate driving integrated circuits 233 may be mounted on the rear surface 100b of the display substrate 100 through a chip mounting process based on a chip-on glass (COG) type. In this case, the gate flexible circuit film 231 may be omitted, and a configuration of the gate driving circuit 230 may be simplified.

The control board 250 may be connected to each of the plurality of data flexible circuit films 211 and each of the plurality of gate flexible circuit films 231. The control board 250 may support the timing controller 270 and may transfer signals and power between the elements of the display driving circuit.

The timing controller 270 may be mounted on the control board 250 and may receive a timing synchronization signal and video data each provided from a display driving system through a user connector provided on the control board 250. Also, the timing controller 270 may generate the data control signal and the gate control signal on the basis of the timing synchronization signal to control a driving timing of each of the plurality of data driving integrated circuits 213 and the plurality of gate driving integrated circuits 233.

Additionally, the plurality of data driving integrated circuits 213, the plurality of gate driving integrated circuits 233, and the timing controller 270 may be configured as one integrated driving IC. In this case, the one integrated driving IC may be mounted on the rear surface 100b of the display substrate 100, and each of the plurality of first routing lines RL1 and the plurality of second routing lines RL2 may be additionally routed on the rear surface 100b of the display substrate 100 and may be electrically connected to a corresponding channel provided in the integrated driving IC. In this case, the plurality of first pad parts PP1, the plurality of second pad parts PP2, the plurality of data flexible circuit films 211, and the plurality of gate flexible circuit films 231 may be omitted.

Figure 4:
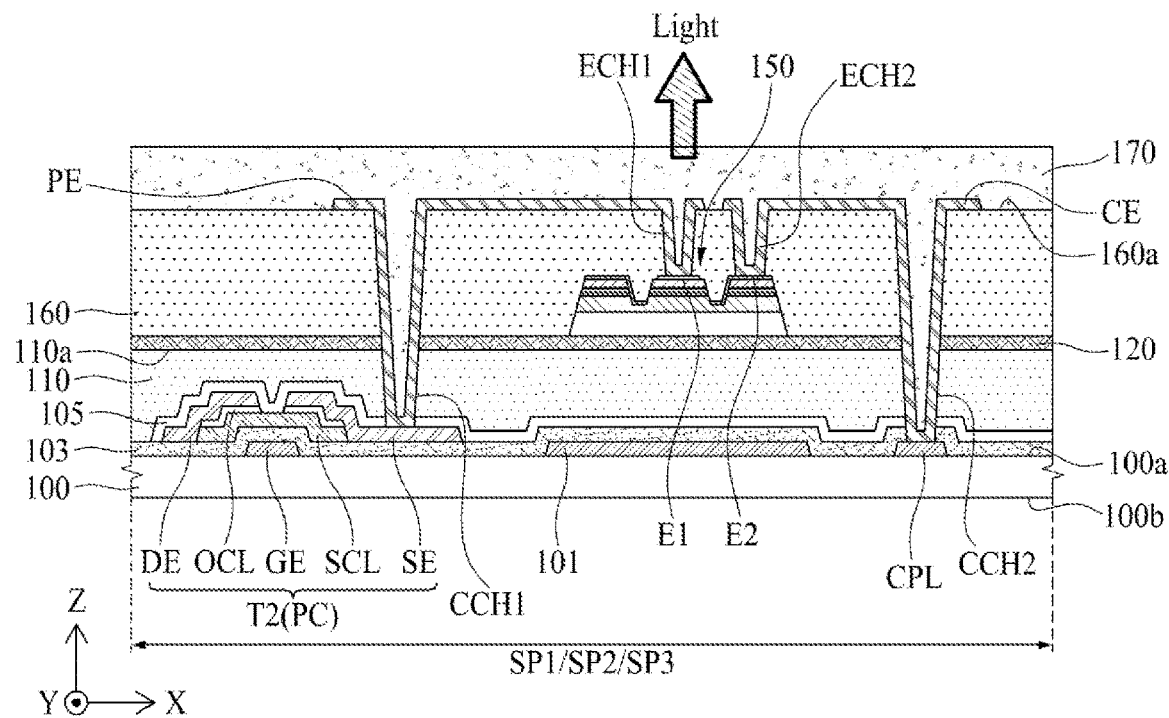
FIG. 4 is a cross-sectional view for describing a structure of one subpixel illustrated in FIG. 3.

FIG. 4 is a cross-sectional view for describing a structure of one subpixel illustrated in FIG. 3.

Referring to FIG. 4, each of a plurality of subpixels SP1, SP2, SP3 of a light emitting diode display apparatus according to an embodiment of the present disclosure may include a pixel circuit PC, a passivation layer 110, a light emitting diode 150, a planarization layer 160, a pixel electrode PE, a common electrode CE, and a transparent buffer layer 170 each provided on a display substrate 100.

The pixel circuit PC may include a switching TFT T1, a driving TFT T2, and a capacitor Cst. The pixel circuit PC may be as described above, and thus, its detailed description is omitted. Hereinafter, a structure of the driving TFT T2 will be described for example.

The driving TFT T2 may include a gate electrode GE, a semiconductor layer SCL, an ohmic contact layer OCL, a source electrode SE, and a drain electrode DE. The driving TFT T2 may have an inversely staggered structure of a bottom gate type as illustrated in FIG. 4, but is not limited thereto and may be applied without being limited to a coplanar structure. Hereinafter, an example where the driving TFT T2 has the inversely staggered structure of the bottom gate type will be described.

The gate electrode GE may be formed on the display substrate 100 along with a gate line GL. The gate electrode GE may be covered by a gate insulation layer 103. The gate insulation layer 103 may be formed of a single layer or a multiplayer including an inorganic material and may include silicon oxide (SiOx), silicon nitride (SiNx), or the like.

The semiconductor layer SCL may be provided as a predetermined pattern (or island) type on the gate insulation layer 103 to overlap the gate electrode GE. The semiconductor layer SCL may include a semiconductor material including one material of amorphous silicon, polycrystalline silicon, oxide, and an organic material.

The ohmic contact layer OCL may be provided as a predetermined pattern (or island) type on the gate insulation layer 103. Here, the ohmic contact layer OCL may be for an ohmic contact between the semiconductor layer SCL and a source/drain electrode SE/DE and may be omitted.

The source electrode SE may be provided on one side of the ohmic contact layer OCL to overlap one side of the semiconductor layer SCL. The source electrode SE may be formed along with a data line DL and a driving power line DPL.

The drain electrode DE may be provided on the other side of the ohmic contact layer OCL to overlap the other side of the semiconductor layer SCL and may be apart from the source electrode SE. The drain electrode DE may be formed along with the source electrode SE and may branch or protrude from an adjacent driving power line DPL.

Additionally, the switching TFT T1 configuring the pixel circuit PC may be provided in the same structure as that of the driving TFT T2. In this case, a gate electrode of the switching TFT T1 may branch or protrude from the gate line GL, a first electrode of the switching TFT T1 may branch or protrude from the data line DL, and a second electrode of the switching TFT T1 may be connected to the gate electrode GE of the driving TFT T2 through a via hole provided in the gate insulation layer 103.

The pixel circuit PC may be covered by an interlayer insulation layer 105. The interlayer insulation layer 105 may be provided all over the display substrate 100 to cover the pixel circuit PC including the driving TFT T2. The interlayer insulation layer 105 according to an embodiment may include an inorganic material such as SiOx or SiNx, but is not limited thereto.

The passivation layer 110 may be provided all over the display substrate 100 to cover a subpixel SP (e.g., the pixel circuit PC), or may be provided all over the display substrate 100 to cover the interlayer insulation layer 105. The passivation layer 110 may protect the pixel circuit PC and may provide a flat surface on the interlayer insulation layer 105. The passivation layer 110 according to an embodiment may include an organic material such as benzocyclobutene or photo acryl.

A reflective layer 101 may be provided between a floor surface of a light emitting diode 150 and the display substrate 100 to overlap the light emitting diode 150 or an emission area DA of the light emitting diode 150 described below. The reflective layer 101 according to an embodiment may include the same material as that of the gate electrode GE of the driving TFT T2 and may be provided on the same layer as that gate electrode GE. The reflective layer 101 may reflect light, emitted from the light emitting diode 150, in an emission direction of the light emitting diode 150. Therefore, the light emitting diode display apparatus according to the present embodiment may include the reflective layer 101, and thus, may have a top emission structure. However, when the light emitting diode display apparatus according to the present embodiment has a bottom emission structure, the reflective layer 101 may be omitted.

Optionally, the reflective layer 101 may include the same material as that of the source/drain electrode SE/DE of the driving TFT T2 and may be provided on the same layer as the source/drain electrode SE/DE.

The micron light emitting diode 150 may be disposed on the display substrate 100 and may be electrically connected to the pixel circuit PC and the common power line CPL, and thus, may emit light with a current flowing from the pixel circuit PC (e.g., the driving TFT T2) through the common power line CPL. The light emitting diode 150 according to an embodiment may include a light emitting diode substrate 151, a light emitting layer EL, a first electrode (or an anode electrode) E1, and a second electrode (or a cathode terminal) E2. A detailed structure of the light emitting diode 150 will be described below with reference to FIGS. 4, 5A and 5B.

The light emitting diode 150 according to an embodiment of the present disclosure may be attached by an adhesive member 120 to correspond to each subpixel SP area. The adhesive member 120 may be omitted depending on a design of the light emitting diode display apparatus.

The planarization layer 160 may be provided on the passivation layer 110 to cover the light emitting diode 150, and moreover, may be provided on the passivation layer 110 to have a thickness enabling the planarization layer 160 to cover a whole upper surface of the passivation layer 110 and a whole front surface of the light emitting diode 150.

The planarization layer 160 may provide a flat surface on the passivation layer 110. Also, the planarization layer 160 may be disposed to cover the light emitting diode 150 mounted on the display substrate 100 and may fix a position of the light emitting diode 150. According to an embodiment, at least a portion of the planarization layer 160 may be disposed to be accommodated into a trench part TP.

The transparent buffer layer 170 may be provided on the display substrate 100 to cover all of the planarization layer 160 where a pixel electrode PE and a common electrode CE are provided, may provide a flat surface on the planarization layer 160, and protect the light emitting diode 150 and the pixel circuit PC from an external impact. Therefore, the pixel electrode PE and the common electrode CE may be provided between the planarization layer 160 and the transparent buffer layer 170. The transparent buffer layer 170 according to an embodiment may include an optical clear adhesive (OCA) or an optical clear resin (OCR), but is not limited thereto.

The pixel electrode PE may connect the first electrode E1 of the light emitting diode 150 to the source electrode SE of the driving TFT T2 and may be referred to as an anode electrode. The pixel electrode PE according to an embodiment may be provided on an upper surface 160a of the planarization layer 160 overlapping the first electrode E1 of the light emitting diode 150 and the driving TFT T2. The pixel electrode PE may be electrically connected to the source electrode SE of the driving TFT T2 through a first circuit contact hole CCH1 which is provided to pass through the interlayer insulation layer 105, the passivation layer 110, and the planarization layer 160 and may be electrically connected to the first electrode E1 of the light emitting diode 150 through a first electrode contact hole ECH1 provided in the planarization layer 160. Accordingly, the first electrode E1 of the light emitting diode 150 may be electrically connected to the source electrode SE of the driving TFT T2 through the pixel electrode PE. When the light emitting diode display apparatus has a top emission type, the pixel electrode PE may include a transparent conductive material, and when the light emitting diode display apparatus has a bottom emission type, the pixel electrode PE may include an optical reflective conductive material. Here, the transparent conductive material may be indium tin oxide (ITO) or indium zinc oxide (IZO) but is not limited thereto. The optical reflective conductive material may be aluminum (Al), silver (Ag), gold (Au), platinum (Pt), or copper (Cu), but is not limited thereto. The pixel electrode PE including the optical reflective conductive material may be formed of a single layer including the optical reflective conductive material or a multilayer where single layers are stacked.

The common electrode CE may electrically connect the second electrode E2 of the light emitting diode 150 to the common power line CPL and may be referred to as a cathode electrode. The common electrode CE may be provided on an upper surface 160a of the planarization layer 160 overlapping the second electrode E2 of the light emitting diode 150 and the common power line CPL. Here, the common electrode CE may include the same material as that of the pixel electrode PE.

One side of the common electrode CE according to an embodiment may be electrically connected to the common power line CPL through a second circuit contact hole CCH2 which is provided to pass through the gate insulation layer 103, the interlayer insulation layer 105, the passivation layer 110, and the planarization layer 160 each overlapping the common power line CPL. The other side of the common electrode CE according to an embodiment may be electrically connected to the second electrode E2 of the light emitting diode 150 through a second electrode contact hole ECH2 provided in the planarization layer 160 to overlap the second electrode E2 of the light emitting diode 150. Therefore, the second electrode E2 of the light emitting diode 150 may be electrically connected to the common power line CPL through the common electrode CE.

The pixel electrode PE and the common electrode CE according to an embodiment may be simultaneously provided through an electrode patterning process using an etch process, a photolithography process, and a deposition process of depositing an electrode material on the planarization layer 160 including the first and second circuit contact holes CCH1 and CCH2 and the first and second electrode contact holes ECH1 and ECH2. Therefore, the common electrode CE and the pixel electrode PE connecting the light emitting diode 150 to the pixel circuit PC may be formed simultaneously, and thus, an electrode connecting process may be simplified and a process time taken in connecting the light emitting diode 150 to the pixel circuit PC may be considerably shortened, thereby enhancing the productivity of the light emitting diode display apparatus.

Figure 5A:
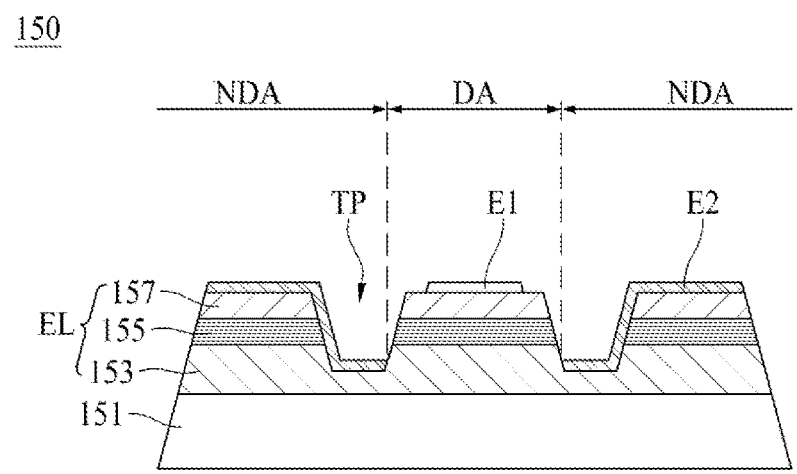
FIGS. 5A and 5B are cross-sectional views for describing a structure of a light emitting diode illustrated in FIG. 4.
Figure 5B:
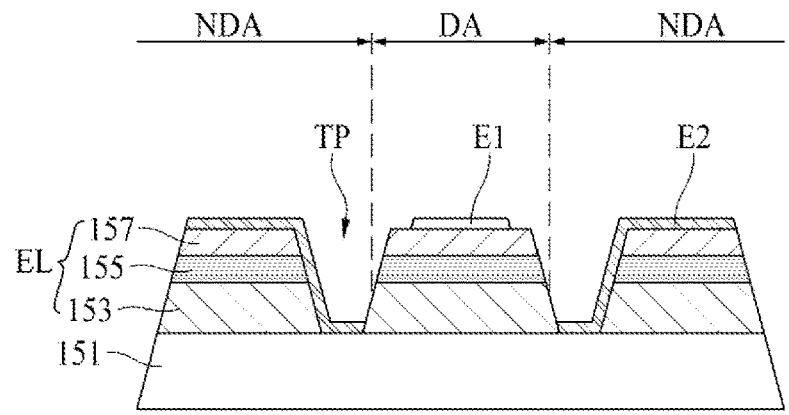

FIGS. 5A and 5B are cross-sectional views for describing a structure of a light emitting diode illustrated in FIG. 4.

Referring to FIG. 5A in conjunction with FIG. 4, a light emitting diode display apparatus according to an embodiment of the present disclosure may include a display substrate 100 where a plurality of subpixel areas are formed and a light emitting diode 150 which includes an emission area DA, disposed at an upper portion of the display substrate 100 to correspond to a center portion of the light emitting diode 150 and disposed to correspond to a subpixel area SP1/SP2/SP3, and a non-emission area NDA adjacent to the emission area DA. The light emitting diode 150 may comprise a light emitting layer EL which includes a first semiconductor layer 153, an active layer 155 provided on the first semiconductor layer 153, and a second semiconductor layer 157 provided on the active layer 155, which are sequentially formed on a light emitting diode substrate 151. The light emitting diode 150 may be provided to overlap a boundary between the emission area DA and the non-emission area NDA and may further include a trench part TP which is formed by removing at least a portion of light emitting layer EL.

According to an embodiment, the light emitting diode substrate 151 may include at least one of sapphire, silicon (Si), silicon carbide (SiC), gallium arsenic (GaAs), and oxide zinc (ZnO), but is not limited thereto and may include a material which has been known to those skilled in the art and is capable of being used as the light emitting diode substrate.

Moreover, the light emitting diode substrate 151 may be used as a growth substrate for growing each of the first semiconductor layer 153, the active layer 155, and the second semiconductor layer 157, and then, may be separated from the first semiconductor layer 153 through a substrate separating process. Here, the substrate separating process may be a laser lift off process or a chemical lift off process. Accordingly, since the light emitting diode substrate 151 for growing the light emitting layer EL is removed from the light emitting diode 150, the light emitting diode 150 may have a relatively thin thickness.

Therefore, the light emitting diode substrate 151 may be provided for forming a subsequent light emitting diode and may be mounted as a type which is omitted in the light emitting diode 150, based on a design of the light emitting diode display apparatus.

The first semiconductor layer 153 may supply an electron to the active layer 155 which will be described below in the light emitting diode 150. According to an embodiment, the first semiconductor layer 153 may be formed of an n-type nitride semiconductor (n-GaN) with silicon impurities doped therein. However, a material of the first semiconductor layer 153 and doped impurities are not limited to the above-described example, and materials applied to the technology field of light emitting diodes may be used without being limited. The first semiconductor layer 153 may supply an electron to the active layer 155 which will be described below in the light emitting diode 150 according to an embodiment of the present disclosure. According to an embodiment, the first semiconductor layer 153 may be a GaN semiconductor layer which has grown by doping n-type impurities. The above-described n-type donor impurities may use silicon.

The active layer 155 may recombine an electron and a hole respectively supplied from the n-type first semiconductor layer 153 and the below-described p-type second semiconductor layer 157 to convert residual energy into light. In more detail, the light emitting diode 150 according to an embodiment of the present disclosure, when a forward voltage is applied, the electron and the hole respectively supplied from the first semiconductor layer 153 and the second semiconductor layer 157 may be recombined in the active layer 155, and photons corresponding to a band gap of the active layer 155 may be generated in a process where the electron and the hole meets and dissipates, and the generated photons may be transferred in an emission direction of the light emitting diode 150, thereby allowing light to be emitted.

According to an embodiment of the present disclosure, the active layer 155 may include a well layer, having a quantum well (QW) structure or having a multiple quantum well (MQW) structure for increasing efficiency, and a barrier layer disposed on at least one side of the well layer. The barrier layer may be formed of a material which is greater in energy band gap than the well layer. According to an embodiment, the active layer 155 may be provided in the MQW structure, and the well layer and the barrier layer may be alternately stacked. Also, the active layer 155 according to an embodiment of the present disclosure may be adjusted to obtain a wavelength of a desired band by controlling a composition and a thickness of the well layer and the barrier layer. For example, the barrier layer may include gallium nitride, but is not limited thereto and may use a configuration and a material of the active layer 155 known to those skilled in the art.

The second semiconductor layer 157 may be formed of a p-type nitride semiconductor (p-GaN) having conductivity by adding magnesium (Mg) as acceptor impurities. The second semiconductor layer 157 may provide a hole to the active layer 155. A material of the second semiconductor layer 157 and doped impurities are not limited to the above-described example, and materials applied to the technology field of light emitting diodes may be used without being limited.

The light emitting diode 150 according to the present disclosure may further include a first electrode E1, which is electrically connected to the second semiconductor layer 157 to overlap the emission area DA, and a second electrode E2 which is electrically connected to the first semiconductor layer 153 to overlap the non-emission area NDA.

The first electrode E1 according to an embodiment of the present disclosure may be a transparent electrode, and at least a portion thereof may be provided to overlap the second semiconductor layer 157 of the emission area DA. Also, the first electrode E1 may be provided in the emission area DA of the light emitting diode 150, and thus, may be a transparent electrode.

According to an embodiment, the first electrode E1 may include at least one of indium tin oxide (ITO), tin oxide, Al-doped zinc oxide (AZO), titanium oxide, tantalum oxide, zirconium oxide, hafnium oxide, and aluminum oxide, which are transparent electrode materials, but is not limited thereto and may use a light-transmitting electrode for transmitting light emitted from the light emitting diode 150 without being limited.

According to an embodiment of the present disclosure, the first electrode E1 may be disposed in a region overlapping the second semiconductor layer 157 of the emission area DA and may be provided on the second semiconductor layer 157.

The second electrode E2 according to an embodiment of the present disclosure may include reflective metal and may be a reflective electrode. An example where the second electrode E2 according to an embodiment of the present disclosure functions as a reflective electrode and enhances the light extraction efficiency of the light emitting diode 150 will be described below with reference to FIGS. 8, 9A, and 9B.

The light emitting diode 150 according to an embodiment of the present disclosure may further include a trench part TP which is formed by removing at least a portion of the light emitting diode 150. Also, according to an embodiment, the trench part TP may be provided in a boundary portion between the emission area DA and the non-emission area NDA. For example, the trench part TP may be formed by removing the second semiconductor layer 157 and the active layer 155. Also, as seen in FIG. 5A, according to some embodiments of the present disclosure, the trench part TP may be formed by further removing at least a portion of the first semiconductor layer 153. Alternatively, as illustrated in FIG. 5B, according to some embodiments of the present disclosure, the trench part TP may be formed by removing all of the second semiconductor layer 157, the active layer 155, and the first semiconductor layer 153. The second electrode E2 may be disposed to cover an upper surface of the second semiconductor layer 157 overlapping the non-emission area NDA and may cover a side surface or a sidewall, exposed by the trench part TP, of each of the second semiconductor layer 157 and the active layer 155 overlapping the non-emission area NDA. Also, the second electrode E2 may cover an upper surface of the second semiconductor layer 157 overlapping the non-emission area NDA as described above and may cover the side surface, exposed by the trench part TP, of each of the second semiconductor layer 157 and the active layer 155 overlapping the non-emission area NDA, and thus, may be electrically connected to the first semiconductor layer 153 exposed by the trench part TP.

According to an embodiment of the present disclosure, the second electrode E2 may be provided to overlap at least a portion of the trench part TP and may be provided to overlap at least a portion of a surface where the trench part TP contacts the first semiconductor layer 153.

The trench part TP according to an embodiment of the present disclosure may have a cross-sectional structure having a trapezoid shape and may have a shape where a top side is wider than a bottom side. Therefore, the trench part TP according to an embodiment of the present disclosure may be provided in a structure having a certain slope. However, the trench part TP according to an embodiment of the present disclosure is not limited to the above-described shape and may have a structure which collects side light, emitted from the light emitting layer EL described below with reference to FIGS. 8, 9A, and 9B, in a display direction of the display apparatus to enhance light extraction efficiency. Accordingly, the trench part TP may have, for example, at least one of a cup structure, an inclined structure, and a concave lens structure.

Moreover, in the light emitting diode 150 illustrated in FIGS. 5A and 5B, an area of each of the emission area DA and the non-emission area NDA may be set for convenience of description and may be adjusted for securing the emission efficiency and luminance of the light emitting diode display apparatus according to the present disclosure. For example, a size of the emission area DA may be one-dimensionally designed to make an area of the emission area DA once or several times as an area of the non-emission area NDA, but is not limited thereto.

Figure 6:
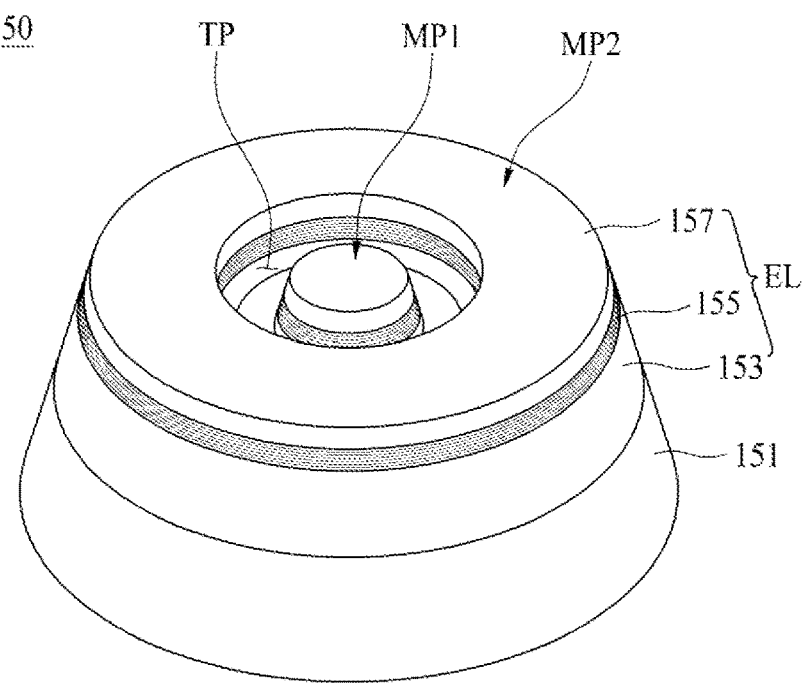
FIG. 6 is a perspective view of a light emitting diode according to an embodiment of the present disclosure.

FIG. 6 is a perspective view of a light emitting diode according to an embodiment of the present disclosure.

FIG. 6 is a perspective view of the light emitting diode of FIGS. 4 and 5A. Referring to FIG. 6, the light emitting diode according to an embodiment of the present disclosure may include a first mesa part MP1 which is provided to overlap an emission area, a second mesa part MP2 which is provided apart from the first mesa part MP1 by a certain interval, and a trench part TP which is provided between the first mesa part MP1 and the second mesa part MP2. The first mesa part MP1 and the second mesa part MP2 may be isolated from each other by the trench part TP.

The first mesa part MP1 may denote a light emitting layer EL which is provided to overlap an emission area DA, and in more detail, may denote a first semiconductor layer 153, an active layer 155, and a second semiconductor layer 157 which are provided to overlap the emission area DA.

The second mesa part MP2 may denote a light emitting layer EL provided to overlap a non-emission area NDA, and in detail, may denote a first semiconductor layer 153, an active layer 155, and a second semiconductor layer 157 which are provided to overlap the non-emission area NDA.

Moreover, the first mesa part MP1 and the second mesa part MP2 may be formed by the trench part TP provided therebetween. The trench part TP may isolate the first mesa part MP1 from the second mesa part MP2. According to some embodiments of the present disclosure, the first mesa part MP1 may have an island shape isolated by the trench part TP, and the second mesa part MP2 may be provided in a partition wall shape adjacent to the first mesa part MP1.

Here, the isolation may denote that the active layer 155 and the second semiconductor layer 157 of the first mesa part MP1 do not communicate with the active layer 155 and the second semiconductor layer 157 of the second mesa part MP2, namely, may denote isolation by the trench part TP.

According to some embodiments of the present disclosure, the trench part TP may be provided as a type where only the second semiconductor layer and the active layer are removed, based on a design of the light emitting diode according to an embodiment of the present disclosure. That is, the trench part TP may be provided as a type where the first semiconductor layer 153 is not removed. When such an example is applied to the first mesa part MP1 and the second mesa part MP2, the first mesa part MP1 may be formed as the active layer 155 and the second semiconductor layer 157 each overlapping the emission area DA, and the second mesa part MP2 may be formed as the active layer 155 and the second semiconductor layer 157 each overlapping the non-emission area NDA.

Moreover, for example, in a case where the trench part TP is formed by removing the active layer 155 and the second semiconductor layer 157 and by additionally removing at least a portion of the first semiconductor layer 153, the first mesa part MP1 may be formed as the first semiconductor layer 153, the active layer 155, and the second semiconductor layer 157 which overlap the emission area DA, and the second mesa part MP2 may be formed as the first semiconductor layer 153, the active layer 155, and the second semiconductor layer 157 which overlap the non-emission area NDA, wherein, the active layer 155 and the second semiconductor layer 157 of the first mesa part MP1 are isolated from the active layer 155 and the second semiconductor layer 157 of the second mesa part MP2 by the trench part TP.

According to some embodiments of the present disclosure, the first mesa part MP1 may be provided in an island shape which is isolated from the second mesa part MP2.

According to an embodiment of the present disclosure, the light emitting diode may include the trench part TP provided between the first mesa part MP1 and the second mesa part MP2, for isolating the second mesa part MP2 from the first mesa part MP1 provided to overlap the emission area DA. The trench part TP may be provided adjacent to the first mesa part MP1, and thus, the first mesa part MP1 may have a structure which is isolated like a certain island. According to an embodiment, the first mesa part MP1 may include a circular surface, as shown in FIG. 6.

According to some embodiments of the present disclosure, the second mesa part MP2 may be provided in a ring structure adjacent to the first mesa part MP1.

To describe a configuration of the mesa part of the first semiconductor layer 153 with reference to FIGS. 5A and 4, it may be seen that the first semiconductor layer 153 corresponding to the emission area DA and the active layer 155 and the second semiconductor layer 157 each provided on the first semiconductor layer 153 are provided in a structure such as an isolated island. Also, it may be seen that the second mesa part MP2 has a ring structure adjacent to the first mesa part with the trench part TP therebetween, and it may be seen that a trench is provided between the first mesa part and the second mesa part.

Moreover, although not shown in FIG. 6, the first electrode E1 may be disposed on the first mesa part MP1 and on the second semiconductor layer 157, and a sidewall of the second mesa part MP2 exposed by the trench part TP may be covered by the second electrode E2 as illustrated in FIG. 5A.

According to an embodiment of the present disclosure, the second electrode E2 may be provided to cover all of an upper surface of the second mesa part MP2 and a sidewall or an etched surface of the second mesa part MP2 contacting the trench part TP. The second electrode E2 may be provided to cover all of the upper surface of the second mesa part MP2 and the etch surface contacting the trench part TP, and thus, may reflect side light, emitted from the first mesa part MP1, in the display direction to enhance light extraction efficiency. Also, according to another embodiment of the present disclosure, the second electrode E2 may be disposed to cover only a sidewall of the second mesa part MP2 exposed by the trench part TP.

Figure 7:
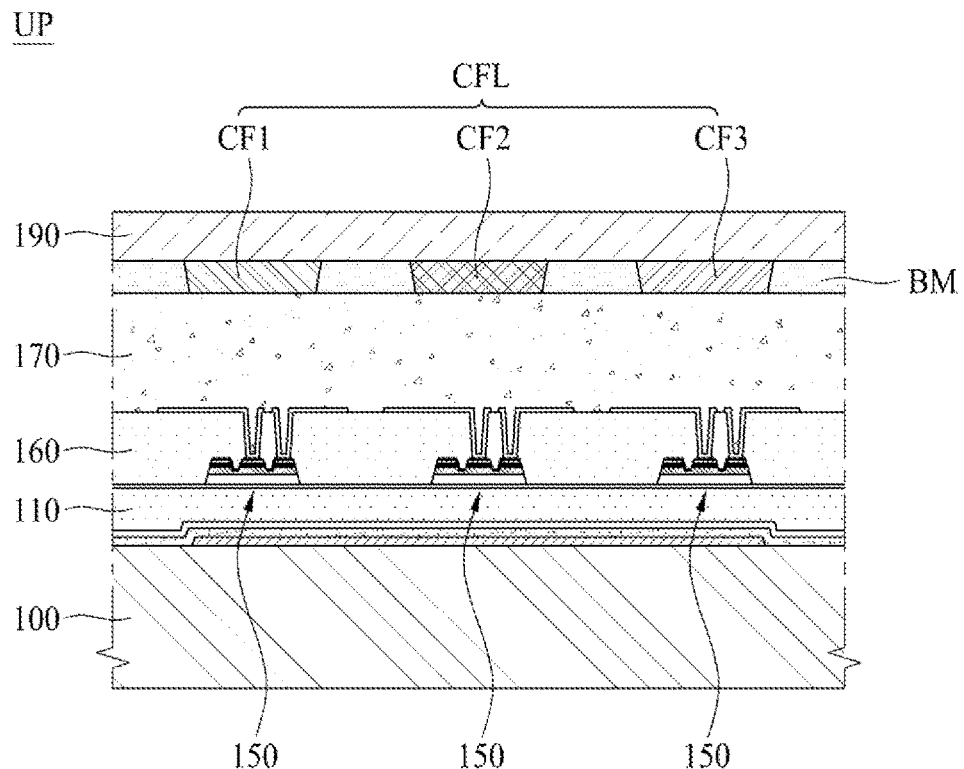
FIG. 7 is a cross-sectional view of a light emitting diode display apparatus according to an embodiment of the present disclosure.

FIG. 7 is a cross-sectional view for describing a light emitting diode according to an embodiment of the present disclosure. FIG. 7 illustrates an example where a color filter is added to a light emitting diode display apparatus according to the present disclosure. Hereinafter, therefore, only elements added to the light emitting diode display apparatus according to the present disclosure will be described.

Referring to FIG. 7 in conjunction with FIG. 4, the light emitting diode display apparatus according to an embodiment of the present disclosure may further include a black matrix BM and a color filter layer CFL.

First, a light emitting diode 150 provided in each of subpixels SP1, SP2, SP3 may emit white light. That is, all light emitting diodes 150 provided on a display substrate 100 may be white light emitting diodes emitting white light.

The black matrix BM may form an opening area of each of the subpixels SP1, SP2, SP3 and the opening area may be directly provided on an upper surface of a transparent buffer layer 170 overlapping the light emitting diode 150 provided in each of the subpixels SP1, SP2, SP3 in a one-to-one relationship, thereby preventing color mixture between adjacent subpixels SP1, SP2, SP3. The black matrix BM may include a light-absorbing material.

The color filter layer CFL may be directly provided on the upper surface of the transparent buffer layer 170 overlapping an opening area formed by the black matrix BM and may include a red color filter CF1, a green color filter CF2, and a blue color filter CF3 corresponding to respective colors formed in the subpixels SP1, SP2, SP3. The color filter layer CFL may transmit only light, having a wavelength of a color corresponding to a corresponding subpixel, of white lights emitted from the subpixels SP1, SP2, SP3.

Additionally, the light emitting diode display apparatus according to an embodiment of the present disclosure may further include a cover layer 190.

The cover layer 190 may be provided on the display substrate 100 to cover all of the black matrix BM and the color filter layer CFL. The cover layer 190 may be provided as a transparent substrate including a glass material or a transparent plastic material. Also, the cover layer 190 may be attached on the black matrix BM and the color filter layer CFL by using a transparent adhesive member. Furthermore, each of the black matrix BM and the color filter layer CFL may be provided on the transparent substrate without being directly provided on an upper surface of the transparent buffer layer 170, and in this case, the transparent substrate including the black matrix BM and the color filter layer CFL may be attached on the upper surface of the transparent buffer layer 170 by using a transparent adhesive member.

In the light emitting diode display apparatus according to an embodiment of the present disclosure, the light emitting diodes 150 having the same colors may be respectively mounted on the subpixels SP1, SP2, SP3, and thus, without differentiating light emitting diodes by colors, a mounting process performed on the light emitting diodes 150 may be performed, and thus, a mounting process time taken in mounting the light emitting diodes may be shortened.

Figure 8:
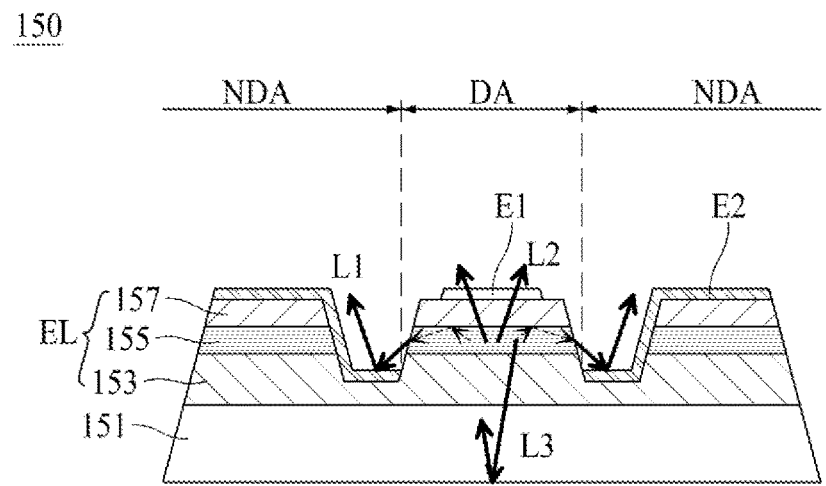
FIG. 8 is a diagram illustrating an emission path of light emitted from a light emitting layer.

FIG. 8 is a diagram illustrating an emission path of light emitted from a light emitting layer.

Referring to FIG. 8, a light emitting diode 150 according to the present disclosure may emit light on the basis of a recombination of an electron and a hole in an active layer 155 overlapping an emission area DA. In this case, light emitted from the active layer 155 overlapping the emission area DA may include side light L1 emitted to a sidewall of the active layer 155, light L2 emitted in a display direction of a light emitting diode display apparatus, and light L3 emitted in a direction opposite to the display direction of the light emitting diode display apparatus.

In this case, the side light L1 emitted to the sidewall of the active layer 155 may be reflected by a second electrode E2 provided in a trench part TP of a non-emission area NDA and may travel upward, thereby enhancing light extraction efficiency.

A general light emitting diode may emit only the light L2 emitted in the display direction of a light emitting diode display apparatus and the light L3 emitted in the direction opposite to the display direction of the light emitting diode display apparatus, and the side light L1 emitted in a direction toward a side of a light emitting layer may not be changed to a display direction of a display apparatus. Due to this, the general light emitting diode may have a problem which is difficult to enhance light extraction efficiency.

On the other hand, the light emitting diode display apparatus according to an embodiment of the present disclosure may be provided in a structure for reflecting the side light L1, emitted to the sidewall of the active layer, in the display direction, thereby enhancing light extraction efficiency.

Figure 9A:
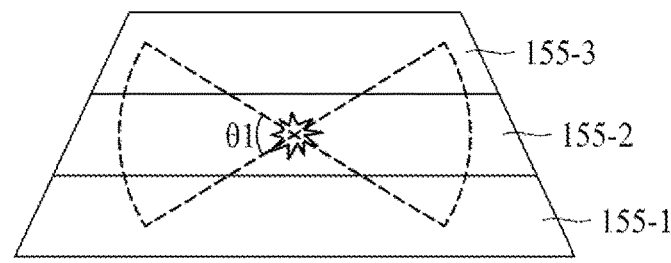
FIGS. 9A and 9B are diagrams illustrating an emission path of light emitted from an active layer.
Figure 9B:
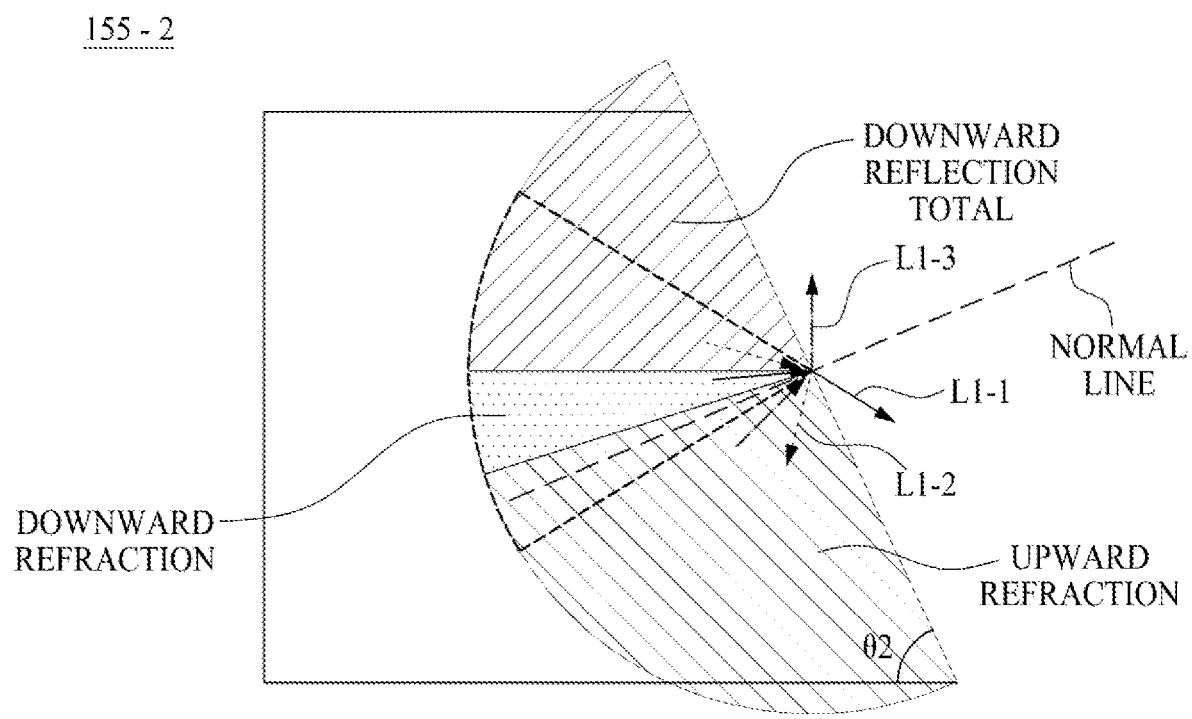

FIGS. 9A and 9B are diagrams illustrating an emission path of light emitted from an active layer 155.

FIGS. 9A and 9B are schematic views for describing an emission path by using a schematic structure of an active layer having a multiple well structure.

FIG. 9A is a diagram for describing a component of side light emitted from an active layer 155. In FIG. 9A, each of a first active layer 155-1 and a third active layer 155-3 are illustrated as a barrier layer including GaN, and a second active layer 155-2 is illustrated as a well layer including indium gallium nitride (InGaN). In this case, a refractive index of GaN included in the first active layer 155-1 and the third active layer 155-3 may be about 2.3, and a refractive index of InGaN included in the second active layer 155-2 may be about 2.7. A first angle θ1 illustrated by a dotted line in FIG. 9A briefly represents a condition where light emitted from the second active layer 155-2 is totally reflected based on Snell's law, and in this case, the first angle θ1 may be about 63.6 degrees.

In other words, in light emitted from the second active layer 155-2, all of light which travels at an inclined angle of ±31.8 degrees with respect to a horizontal line crossing the second active layer 155-2 may be trapped in the second active layer 155-2 due to total reflection, and the light may travel in a direction toward a side surface of the active layer, instead of a direction toward an upper portion or a lower portion of the active layer. In a display apparatus including the general light emitting diode, side light arithmetically corresponding to about 35% (63.6 degrees/180 degrees) may not contribute to light extraction efficiency.

Light may be directly output in the display direction of the light emitting diode display apparatus within a range of an angle (e.g., about 126.4 degrees) outside about 63.6 degrees which is an angle θ1 for total reflection or may be output a direction opposite to the display direction of the light emitting diode display apparatus, and light emitted in a direction opposite to the display direction of the light emitting diode display apparatus may be reflected by a reflecting layer 101 (see FIG. 4) disposed under the light emitting diode 150 and may travel in the display direction.

FIG. 9B is a schematic view for describing an emission path in a case where light emitted from the second active layer 155-2 to a side surface reaches the trench part TP. In FIG. 9B, an inclined angle θ2 of the second active layer 155-2 may be set to about 68 degrees.

In FIG. 9B, light totally reflected from the inside of the second active layer 155-2 may travel to a sidewall (e.g., the trench part TP) of the second active layer 155-2 within an angle range of ±31.8 degrees, and a refractive index in the trench part TP may be considered to be 1 which is a refractive index of an air layer. In this case, the Snell's law may be applied, and thus, when light is incident at an angle outside a critical angle with respect to a sidewall of the second active layer 155-2, all of the light may be totally reflected (L1-2). In this case, the critical angle may be 21.8 degrees. In other words, side light incident at an angle within the critical angle may be upward refracted (L1-3) in the display direction of the light emitting diode display apparatus, or may be downward refracted (L1-1) in a direction opposite to the display direction of the light emitting diode display apparatus.

In FIG. 9B, in a region illustrated as upward refraction, when light is incident on the sidewall of the second active layer 155-2 or a sidewall of a first mesa part MP at a corresponding angle, the light may be upward refracted and emitted (L1-3), and in a region illustrated as downward total reflection, when light is incident on the sidewall of the second active layer 155-2 or the sidewall of the first mesa part MP at a corresponding angle, the light may be downward totally reflected (L1-2). At this time, light which is downward totally reflected may be output in the display direction of the display apparatus through total reflection occurring in the active layer 155, or may be reflected by a reflector and may be used as a source light.

In the light emitting diode 150 according to an embodiment of the present disclosure, downward-refracted (L1-1) light discharging from the second active layer 155-2 to the trench part TP may be reflected in the display direction of the display apparatus by the second electrode E2 provided in the trench part TP, thereby enhancing light extraction efficiency.

In FIGS. 9A and 9B, a slope of an active layer and a condition of total reflection of light emitted from the active layer may be changed based on a design of a light emitting diode, but are not limited to an example illustrated in each of FIGS. 9A and 9B.

According to an embodiment of the present disclosure, light emitted from an active layer of a light emitting diode may have a side light component in characteristic as illustrated in FIGS. 9A and 9B, and even in an active layer and a light emitting diode each set to a condition differing from FIGS. 9A and 9B, a structure where downward-refracted light (L1-1) of side light deviating from the active layer is reflected in the display direction may be provided, thereby providing a light emitting diode display apparatus with improved light extraction efficiency.

Figure 10:
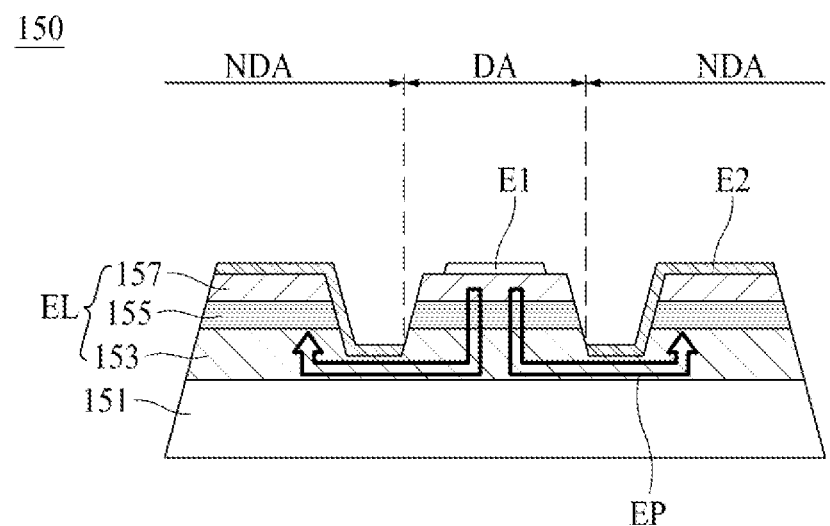
FIG. 10 is a diagram for describing a path of a current generated by a light emitting diode.

FIG. 10 is a diagram for describing a path of a current generated by a light emitting diode.

A light emitting diode 150 according to an embodiment of the present disclosure may have a radial current path which enables light to travel from an emission area DA to a non-emission area NDA adjacent to the emission area DA. That is, the light emitting diode 150 according to an embodiment of the present disclosure may have a radial current path which enables light to diffuse from a first mesa part MP1 to a second mesa part MP2 adjacent to the first mesa part MP1 in a ring shape. Here, since the second mesa part MP2 is provided in a ring shape, a wide electron-hole recombination area may be provided, and thus, an electron-hole recombination rate may increase, thereby increasing emission efficiency. The general light emitting diode may have a problem where an electron-hole recombination is limited due to having a rectilinear current path.

Figure 11:
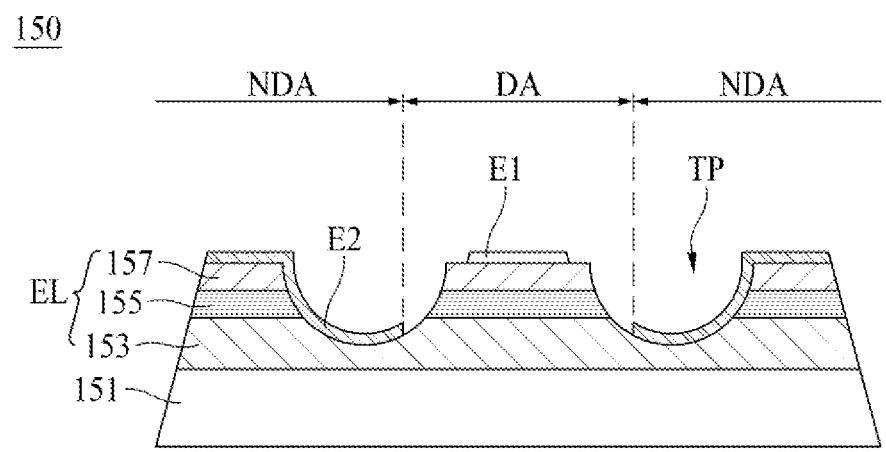
FIG. 11 is a cross-sectional view of a light emitting diode according to another embodiment of the present disclosure.

FIG. 11 is a cross-sectional view of a light emitting diode according to another embodiment of the present disclosure.

Referring to FIG. 11, a trench part TP of a light emitting diode 150 according to an embodiment of the present disclosure is not limited to having an angular cross-sectional structure illustrated in FIGS. 5A and 6 and may be configured as a trench part including a circular cross-sectional shape. According to an embodiment of the present disclosure, the trench part TP may be provided in a concave shape with respect to side light so that the side light emitted from a light emitting layer EL of an emission area DA is collected in a display direction of a display apparatus.

However, the trench part TP according to an embodiment of the present disclosure is not limited to the above-described shape and may be applied to all structures which collect the side light, emitted from the light emitting layer EL described above with reference to FIGS. 8, 9A, and 9B, in the display direction of the display apparatus to enhance light extraction efficiency. Accordingly, the trench part TP may have, for example, at least one of a cup structure, an inclined structure, and a concave lens structure.

Figure 12:
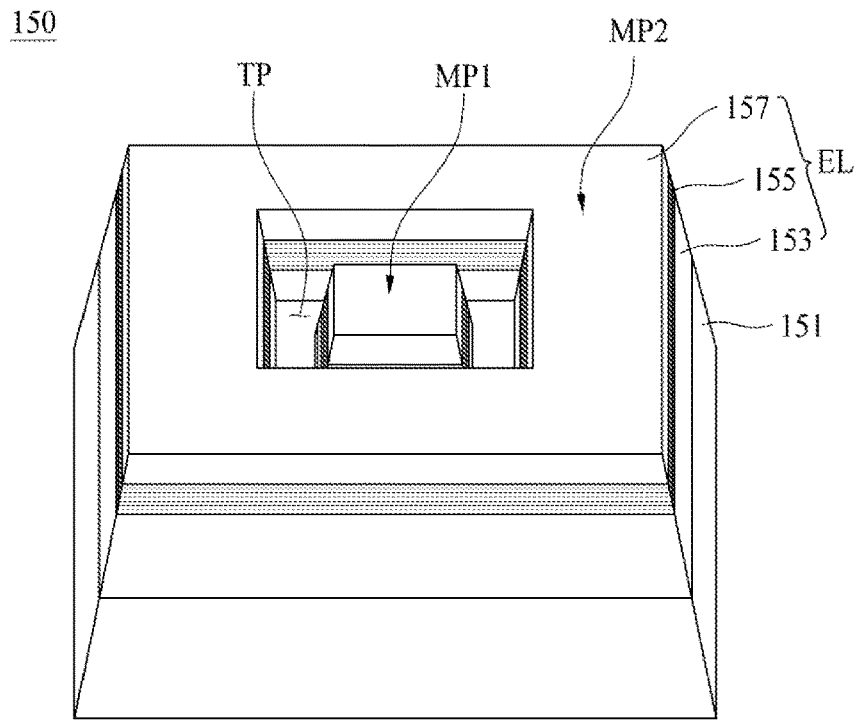
FIG. 12 is a perspective view of a light emitting diode according to another embodiment of the present disclosure.

FIG. 12 is a perspective view of a light emitting diode 150 according to another embodiment of the present disclosure.

Except for that a first mesa part MP1 includes a tetragonal surface and a trench part TP and a second mesa part MP2 are provided to correspond to a shape of the first mesa part MP1, the light emitting diode 150 of FIG. 12 is the same as the light emitting diode 150 of FIG. 6, and thus, a repetitive description is omitted.

Referring to FIG. 12, the light emitting diode 150 according to an embodiment of the present disclosure may include a first mesa part MP1 which is provided to overlap an emission area DA, a second mesa part MP2 which is provided apart from the first mesa part MP1 by a certain interval, and a trench part TP which is provided between the first mesa part MP1 and the second mesa part MP2. The first mesa part MP1 and the second mesa part MP2 may be isolated from each other by the trench part TP.

According to some embodiments of the present disclosure, the first mesa part MP1 may be provided in an island shape which is isolated from the second mesa part MP2.

According to an embodiment of the present disclosure, the light emitting diode 150 may include the trench part TP provided between the first mesa part MP1 and the second mesa part MP2, for isolating the second mesa part MP2 from the first mesa part MP1 provided to overlap the emission area DA. The trench part TP may be provided adjacent to the first mesa part MP1, and thus, the first mesa part MP1 may have a structure which is isolated like a certain island. According to an embodiment, the first mesa part MP1 may include a tetragonal surface.

In FIGS. 6 and 12, the first mesa part MP1 is illustrated as including a circular or tetragonal surface, but a shape of the first mesa part MP1 is not limited thereto and may be provided in various shapes. For example, the first mesa part MP1 may be provided in various shapes including a surface such as a rectangular surface, an oval surface, or a lozenge surface. Also, the trench part TP and the second mesa part MP2 may be provided in a shape corresponding to a shape of the first mesa part MP1.

Figure 13:
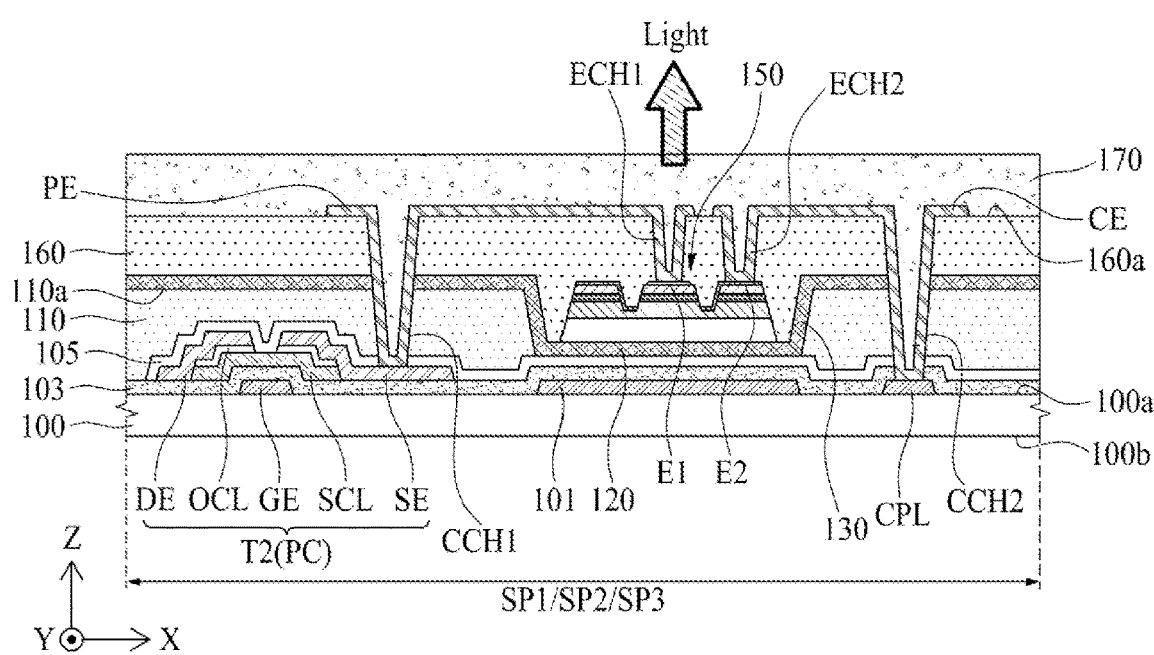
FIG. 13 is a cross-sectional view for describing a subpixel structure of a light emitting diode display apparatus according to another embodiment of the present disclosure.

FIG. 13 is a cross-sectional view for describing a subpixel structure of a light emitting diode display apparatus according to another embodiment of the present disclosure.

Except for that a concave part 130 is additionally provided, the light emitting diode display apparatus of FIG. 13 is the same as the light emitting diode display apparatus of FIG. 4, and thus, its repetitive description is omitted.

The light emitting diode display apparatus according to another embodiment of the present disclosure may further include a concave part 130 which is provided to be concavely recessed from a passivation layer 110 by a certain depth. A light emitting diode 150 may be accommodated into the concave part 130. In a process of mounting the light emitting diode 150 in each of a plurality of subpixels SP1, SP2, SP3, the concave part 130 may prevent the light emitting diode 150 from deviating therefrom, and the alignment precision of the light emitting diode 150 may be enhanced.

Here, a floor surface of the concave part 130 may be formed by removing a portion of the passivation layer 110, the whole of the passivation layer 110, the whole of the passivation layer 110 and a portion of an interlayer insulation layer 105, or the whole of each of the passivation layer 110, the interlayer insulation layer 105, and a gate insulation layer 103 to have a certain depth, based on a thickness of the light emitting diode 150. For example, the concave part 130 may be provided to have a depth of about 2 μm to about 6 μm from an upper surface of the passivation layer 110. The concave part 130 may have a groove or cup shape having a size which is wider than a rear surface (or a lower surface) of the light emitting diode 150.

In the light emitting diode display apparatus according to an embodiment of the present disclosure, the light emitting diode 150 mounted in each subpixel SP may be attached on a floor surface of a corresponding concave part 130 by an adhesive member 120.

The adhesive member 120 may be disposed between the light emitting diode 150 and the concave part 130 of each subpixel SP and may attach the light emitting diode 150 on a floor surface of a corresponding concave part 130, and thus, may primarily fix the light emitting diode 150.

The adhesive member 120 according to an embodiment may be attached (or coated) on a rear surface of the light emitting diode 150 (e.g., a rear surface of a first semiconductor layer 153), and in a process of mounting the light emitting diode 150, the adhesive member 120 may be attached on the concave part 130 of each subpixel SP.

A light emitting diode display apparatus according to the present disclosure may also be configured as follows.

A light emitting diode display apparatus according to an embodiment of the present disclosure includes a display substrate where a plurality of subpixel areas are formed and a light emitting diode disposed on the display substrate to correspond to a corresponding subpixel area of the plurality of subpixel areas, the light emitting diode including an emission area and a non-emission area adjacent to the emission area, wherein the light emitting diode includes a first semiconductor layer, an active layer disposed on the first semiconductor layer, a second semiconductor layer disposed on the active layer, and a trench part provided to overlap a boundary between the emission area and the non-emission area.

According to some embodiments of the present disclosure, the light emitting diode included in the light emitting diode display apparatus is a micro light emitting diode (μLED) having a size of several tens μm or less.

It should be noted that, although in the above, the principle of improving the light extraction efficiency of the light emitting diode display apparatus according to the present disclosure has been described, with a case where the second electrode is disposed in the trench part TP as an example, those skilled in the art would understand that, in the case where the second electrode is not disposed in the trench part TP, the downward refracted (L1-1) light discharging from the second active layer 155-2 to the trench part TP may be reflected in the display direction of the display apparatus by the bottom surface of the trench part TP. In the case where the second electrode is disposed in the trench part TP, the reflectance is higher than that in the case where the second electrode is not disposed in the trench part TP, and thus the light extraction efficiency is higher.

According to some embodiments of the present disclosure, the trench part is formed by removing each of the second semiconductor layer and the active layer.

According to some embodiments of the present disclosure, the trench part is formed by further removing at least a portion of the first semiconductor layer.

According to some embodiments of the present disclosure, the trench part is formed by removing each of the second semiconductor layer, the active layer, and the first semiconductor layer.

According to some embodiments of the present disclosure, the trench part has a cross-sectional structure having a trapezoid shape.

According to some embodiments of the present disclosure, the trench part includes a bottom side and a top side which is wider than the bottom side.

According to some embodiments of the present disclosure, the light emitting diode includes a first electrode electrically connected to the second semiconductor layer to overlap the emission area and a second electrode electrically connected to the first semiconductor layer to overlap the non-emission area.

According to some embodiments of the present disclosure, the light emitting diode display apparatus further includes a planarization layer disposed on the light emitting diode to cover the light emitting diode, wherein at least a portion of the planarization layer is disposed to be accommodated into the trench part.

According to some embodiments of the present disclosure, the first electrode is a transparent electrode.

According to some embodiments of the present disclosure, the second electrode is a reflective electrode including reflective metal.

A light emitting diode display apparatus according to an embodiment of the present disclosure includes a display substrate where a plurality of subpixel areas are formed and a light emitting diode disposed on the display substrate to correspond to a corresponding subpixel area of the plurality of subpixel areas, the light emitting diode including an emission area corresponding to a center portion thereof and a non-emission area adjacent to the emission area, wherein the light emitting diode includes a first mesa part in the emission area, a second mesa part apart from the first mesa part by a certain interval, and a trench part between the first mesa part and the second mesa part.

According to some embodiments of the present disclosure, the first mesa part has an island shape isolated by the trench part, and the second mesa part has a partition wall shape adjacent to the first mesa part.

According to some embodiments of the present disclosure, each of the first mesa part and the second mesa part includes a first semiconductor layer, an active layer disposed on the first semiconductor layer, and a second semiconductor layer disposed on the active layer.

According to some embodiments of the present disclosure, the trench part is formed by removing each of the second semiconductor layer and the active layer.

According to some embodiments of the present disclosure, the trench part is formed by further removing at least a portion of the first semiconductor layer.

According to some embodiments of the present disclosure, the trench part is formed by removing each of the second semiconductor layer, the active layer, and the first semiconductor layer.

According to some embodiments of the present disclosure, the trench part includes a bottom side and a top side which is wider than the bottom side.

According to some embodiments of the present disclosure, the light emitting diode includes a first electrode electrically connected to the second semiconductor layer to overlap the emission area and a second electrode electrically connected to the first semiconductor layer to overlap the non-emission area.

According to some embodiments of the present disclosure, the light emitting diode display apparatus further includes a planarization layer disposed on the light emitting diode to cover the light emitting diode, wherein at least a portion of the planarization layer is disposed to be accommodated into the trench part.

According to some embodiments of the present disclosure, the first electrode is a transparent electrode.

According to some embodiments of the present disclosure, the second electrode is a reflective electrode including reflective metal.

The above-described feature, structure, and effect of the present disclosure are included in at least one embodiment of the present disclosure, but are not limited to only one embodiment. Furthermore, the feature, structure, and effect described in at least one embodiment of the present disclosure may be implemented through combination or modification of other embodiments by those skilled in the art. Therefore, content associated with the combination and modification should be construed as being within the scope of the present disclosure.

It will be apparent to those skilled in the art that various modifications and variations can be made in the present disclosure without departing from the spirit or scope of the disclosures. Thus, it is intended that the present disclosure covers the modifications and variations of this disclosure provided they come within the scope of the appended claims and their equivalents.

The various embodiments described above can be combined to provide further embodiments. Further changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A light emitting diode display apparatus, comprising:
a pixel disposed on a substrate and configured to display an image,
wherein the pixel includes:
a transistor including a gate electrode, a semiconductor layer, a source electrode, and a drain electrode;
a first light emitting portion configured to electrically connect to a first driving power line;
a second light emitting portion configured to electrically connect to a second driving power line;
a common power line configured to electrically connect the first light emitting portion and the second light emitting portion in common;
a light emitting diode having an upper surface, a sidewall, and a bottom surface;
a first electrode on the upper surface of the light emitting diode electrically connected to the source electrode;
a second electrode on the bottom surface of the light emitting diode electrically connected to the common power line;
a passivation layer on the thin film transistor;
a planarization layer on the light emitting diode to cover the light emitting diode; and
an adhesive member between the passivation layer and the light emitting diode.

2. The light emitting diode display apparatus of claim 1, wherein the first driving power line is electrically connected to the drain electrode.

3. The light emitting diode display apparatus of claim 1, wherein the first electrode and the second electrode are disposed side by side.

4. The light emitting diode display apparatus of claim 1, further comprising a concave part recessed concavely from a top surface of the passivation layer by a selected depth, the concave part accommodating the light emitting diode.

5. The light emitting diode display apparatus of claim 1, further comprising:
a pixel electrode configured to electrically connect the first electrode of the light emitting diode to the source electrode; and
a common electrode configured to electrically connect the second electrode of the light emitting diode to the common power line.

6. The light emitting diode display apparatus of claim 5, wherein at least part of the pixel electrode and the common electrode are disposed on a same plane as a top surface of the planarization layer.

7. The light emitting diode display apparatus of claim 5, wherein the pixel electrode is electrically connected to the source electrode through a first circuit contact hole provided in the passivation layer and the planarization layer.

8. The light emitting diode display apparatus of claim 5, wherein the pixel electrode is electrically connected to the first electrode through a first electrode contact hole provided in the planarization layer.

9. The light emitting diode display apparatus of claim 5, wherein the common electrode is electrically connected to the common power line through a second circuit contact hole provided in the passivation layer and the planarization layer.

10. The light emitting diode display apparatus of claim 5, wherein the common electrode is electrically connected to the second electrode through a second electrode contact hole provided in the planarization layer.

11. The light emitting diode display apparatus of claim 1, further comprising:
a reflecting layer between the substrate and the light emitting diode, and overlapping with the light emitting diode.

12. The light emitting diode display apparatus of claim 11, wherein the reflecting layer is on a same layer with at least one of the gate electrode, the source electrode, and the drain electrode.

13. The light emitting diode display apparatus of claim 1, further comprising:
a transparent buffer layer on the planarization layer;
a cover layer on the transparent buffer layer; and
a black matrix and a color filter layer between the cover layer and the transparent buffer layer,
wherein the color filter layer overlaps the light emitting diode.

14. The light emitting diode display apparatus of claim 1, further comprising:
a display driving circuit disposed on a rear surface of the substrate.

15. The light emitting diode display apparatus of claim 14, the display driving circuit comprising:

a data driving circuit in a first periphery in a rear surface of the substrate; and a gate driving circuit in a second periphery in a rear surface of the substrate.

16. The light emitting diode display apparatus of claim 15, wherein the data driving circuit includes:

a first pad part;

a first routing line electrically connect a data line provided on a front surface of the substrate and the first pad part;

a data flexible circuit film attached on the first pad part; and a data driving integrated circuit mounted on the data flexible circuit film.

17. The light emitting diode display apparatus of claim 15, wherein the gate driving circuit includes:

a second pad part;

a second routing line electrically connect a gate line provided on a front surface of the substrate and the second pad part;

a gate flexible circuit film attached on the first pad part; and a gate driving integrated circuit mounted on the gate flexible circuit film.

18. The light emitting diode display apparatus of claim 1, wherein the common power line is on a same layer with one of the gate electrode, the source electrode, and the drain electrode.

19. The light emitting diode display apparatus of claim 1, wherein the upper surface and the sidewall are a first mesa part, and the bottom surface is a trench part.

20. The light emitting diode display apparatus of claim 1, wherein the first driving power line is disposed in a first direction and the common power line is disposed in a second direction, different direction than the first direction.

21. The light emitting diode display apparatus of claim 1, wherein the first driving power line is parallel to the second driving power line.

* * * * *